US007573286B2

(12) United States Patent
Huelson et al.

(10) Patent No.: US 7,573,286 B2
(45) Date of Patent: Aug. 11, 2009

(54) SYSTEM AND METHOD FOR TESTING DISPLAYS

(75) Inventors: Phillip Wayne Huelson, Los Gatos, CA (US); Laurent Heughebaert, Goleta, CA (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 261 days.

(21) Appl. No.: 10/439,387

(22) Filed: May 16, 2003

(65) Prior Publication Data

US 2004/0227708 A1 Nov. 18, 2004

(51) Int. Cl.
*G01R 31/00* (2006.01)
*G09G 3/30* (2006.01)

(52) U.S. Cl. .......................... 324/770; 345/76; 345/904

(58) Field of Classification Search ............. 345/76–84, 345/156, 158, 169, 904; 324/770, 537; 348/181
See application file for complete search history.

(56) References Cited

U.S. PATENT DOCUMENTS

| | | | | |
|---|---|---|---|---|
| 5,319,437 | A * | 6/1994 | Van Aken et al. | 356/326 |
| 5,499,040 | A | 3/1996 | Taylor et al. | |
| 5,508,607 | A * | 4/1996 | Gibson | 324/121 R |
| 5,572,444 | A * | 11/1996 | Lentz et al. | 702/117 |
| 5,608,422 | A * | 3/1997 | Ikeda | 345/101 |
| 5,757,365 | A * | 5/1998 | Ho | 345/212 |
| 5,861,882 | A * | 1/1999 | Sprenger et al. | 715/700 |
| 5,990,858 | A * | 11/1999 | Ozolins | 345/99 |
| 6,426,736 | B1 * | 7/2002 | Ishihara | 345/102 |
| 6,563,301 | B2 * | 5/2003 | Gventer | 324/158.1 |
| 6,657,648 | B1 * | 12/2003 | Aoki | 345/204 |
| 6,747,618 | B2 * | 6/2004 | Arnold et al. | 345/77 |
| 6,819,316 | B2 * | 11/2004 | Schulz et al. | 345/174 |
| 6,911,961 | B2 * | 6/2005 | Miller et al. | 345/82 |
| 7,023,234 | B2 * | 4/2006 | Tomita | 324/770 |
| 2002/0047565 | A1 | 4/2002 | Nara et al. | |
| 2003/0020703 | A1 | 1/2003 | Holub | |

FOREIGN PATENT DOCUMENTS

| | | |
|---|---|---|
| EP | 1 111 572 A2 | 6/2001 |

* cited by examiner

*Primary Examiner*—Bipin Shalwala
*Assistant Examiner*—Steven E Holton
(74) *Attorney, Agent, or Firm*—John H. Lamming

(57) ABSTRACT

A system 100 for testing light-emitting diode (LED) displays is disclosed. The system is implemented within a portable handheld housing and includes a computing module 102, a test module 104, and an adaptor module 106. The computing module 102 includes a rechargeable battery 118 for providing electrical power to the system; a processor 122 for running operational software for testing an LED display 108; and a user interface 114 that allows a user to select from multiple test options for testing the LED display and that displays measured operational attributes of the display to the user. The test module 104 includes a nonvolatile memory unit for storing test images to be displayed on the LED display, and a data acquisition and control circuit for communicating power and control signals for displaying the test images on the LED display, and for measuring operational attributes of the LED display. The adaptor module 106 is adapted to be selectively and communicatively coupled to the LED display 108, and to automatically to identify the type of LED display attached. The adaptor module 106 communicates the display type to computing module 102, which uses the type to determine test options available for the LED display 108 and to select corresponding test images and power and control signals to communicate to the LED display 108.

22 Claims, 11 Drawing Sheets

Continued from Fig. 4A

SYSTEM AND METHOD FOR TESTING DISPLAYS

FIELD OF THE INVENTION

The present invention generally relates to a system and method for testing electronic displays and more particularly, to an improved system and method for testing light-emitting diode (LED) displays, which provides a portable, integrated test environment for testing multiple types of LED displays.

BACKGROUND OF THE INVENTION

Light-emitting diode (LED) displays, such as inorganic and organic light-emitting diode (OLED) displays (e.g., polymer, small molecule and metal ligand complex type displays), are typically tested after manufacture to ensure that the displays are operating properly. For example, a display may be tested to ensure that all pixels on the display are operational, that the display pixels provide a desired brightness, that the display can properly show certain images and sequences of images (e.g., animations), and that the display supports certain power, current and voltage requirements. A number of testing devices are generally required in order to perform all of these different tests and in order to view, log and analyze the test results. Furthermore, different types of testing devices and test procedures are required to test different types of displays. All of these various testing devices that are required result in substantial drawbacks. For instance, the large number of devices are undesirably expensive, and require the displays to be connected and disconnected to several different devices at several different testing locations, thereby increasing the amount of time required to test a display. Additionally, all these devices are typically bulky and lack portability. As such, they cannot be readily transferred to test different types of displays outside of a lab.

For these reasons, it would be desirable to provide an improved system and method for testing LED displays, which provides a portable, integrated test environment for testing multiple types of LED displays.

SUMMARY OF THE INVENTION

One advantage of the invention is that it provides a system for testing LED displays that is adapted for portable (e.g., handheld) use and that is capable of testing multiple types of LED displays.

Another advantage of the invention is that is reduces the time to market of new LED display products by reducing or eliminating the need to develop new hardware to demonstrate test new LED display devices.

Another advantage of the invention is that it provides a tremendous amount of user insight into display operation and programming requirements in a user-friendly, convenient manner.

Another advantage of the invention is that it integrates a bench-top full of specialized and potentially very expensive test tools into one inexpensive portable device.

Another advantage of the invention is that it provides a stable and flexible test environment that allows a user to select and/or create tests for different types of LED displays and for user-specific applications.

According to one aspect of the present invention, a portable, integrated system for testing electronic displays is provided. The system includes a power supply for providing electrical power to the system; a computing module for running operational software for testing an electronic display based on a display type; a memory unit for storing test images which are selectively displayed on the electronic display; a test circuit that is communicatively coupled to the computing module and the memory unit and that is adapted to provide control and power signals to the electronic display for testing and displaying the test images on the electronic display according to the operational software, and to measure operational attributes of the display; an adaptor module that is communicatively coupled to the test circuit and that is adapted to be removably coupled to the electronic display and to communicate power and control signals to the electronic display, the adaptor module including a display identification circuit that is adapted to identify the display type of the electronic display and to communicate the display type to the test portion; and a user interface that is adapted to accept user input data into the system for testing the electronic display and to display operational attributes of the electronic display.

According to another aspect of the invention, a system for testing an LED display is provided. The system includes a computing module, a test module and an adaptor module. The computing module includes a rechargeable power supply for providing electrical power to the system; a processing element for running operational software for testing an LED display; and user interface that is adapted to allow a user to select from a plurality of test options for testing the LED display and that is adapted to display measured operational attributes of the display. The test module is communicatively coupled to the computing module, and includes a nonvolatile memory unit for storing test images to be displayed on the LED display; and a data acquisition and control circuit for communicating power and control signals for displaying the test images on the LED display, and for measuring operational attributes of the LED display. The adaptor module is communicatively coupled to the test module and is adapted to be selectively and communicatively coupled to the LED display, to identify a type of the LED display and communicating the type to computing module, which uses the type to determine the plurality of test options for the LED display and to select corresponding test images and power and control signals to communicate to the LED display. A portable housing operatively contains the computing, test and adaptor modules, and includes a removable cover portion that is adapted to receive and secure the LED display for testing.

According to another aspect of the invention, a method for testing electronic display modules is provided. The method includes the steps of: providing a portable testing module; removably attaching an electronic display to the portable testing module; automatically detecting a type of the electronic display by use of the testing module; providing test options for a user to select based on the display type; receiving test option selections from the user; providing signals to the electronic display based on the test option selections, effective to cause the electronic display to display selected images; measuring operational attributes of the display; and displaying the measured operational attributes to the user.

The novel features of this invention, as well as the invention itself, will be best understood from the following drawings and detailed description.

DETAILED DESCRIPTION OF THE EMBODIMENTS

The present invention will now be described in detail with reference to the drawings, which are provided as illustrative examples of the invention so as to enable those skilled in the art to practice the invention. Notably, the implementation of certain elements of the present invention may be accomplished using software, hardware, firmware or any combination thereof, as would be apparent to those of ordinary skill in the art, and the figures and examples below are not meant to limit the scope of the present invention. Moreover, where certain elements of the present invention can be partially or fully implemented using known components, only those portions of such known components that are necessary for an understanding of the present invention will be described, and detailed descriptions of other portions of such known components will be omitted so as not to obscure the invention. Preferred embodiments of the present invention are illustrated in the Figures, like numerals being used to refer to like and corresponding parts of various drawings.

I. System Architecture

Figure 1:
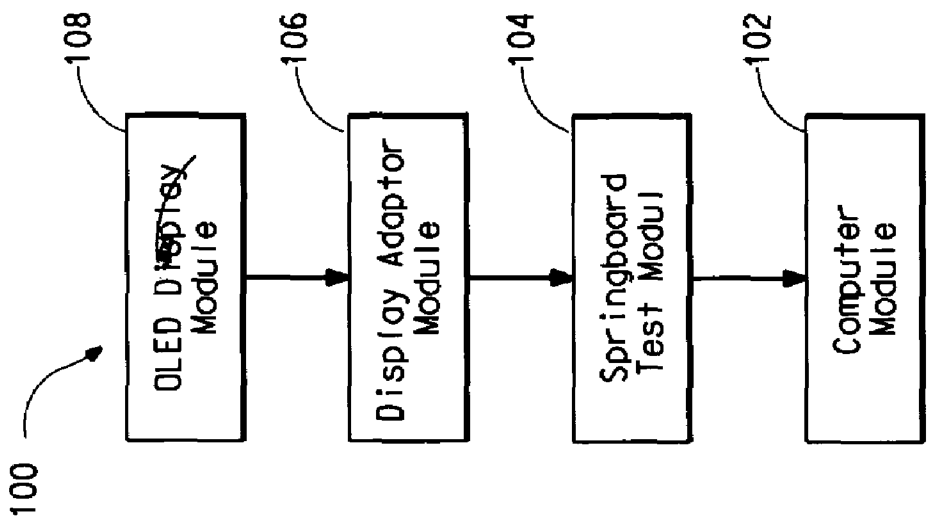
FIG. 1 is block diagram illustrating the general components of a system for testing LED displays according to the present invention.

FIG. 1 is a block diagram illustrating the general components of a system 100 for testing electronic displays, such as light-emitting diode (LED) displays, which may include organic light-emitting diode (OLED) displays (e.g., polymer, small molecule, and metal ligand complex, as the light emitting material, type displays). As shown, the system 100 includes a portable or handheld computing module 102, a springboard module 104 (can optionally have output ports to measure a variety of data from the test display for monitoring its performance; for example, luminescence and current consumption), and a display adaptor module 106 (may be a pin connector to connect and feed the display test data to a computer (e.g., a laptop, PDA, or desk top) to be analyzed and treated), which is adapted to receive and identify an LED display 108 and to communicate signals to and from the LED display 108 for testing.

Figure 2:
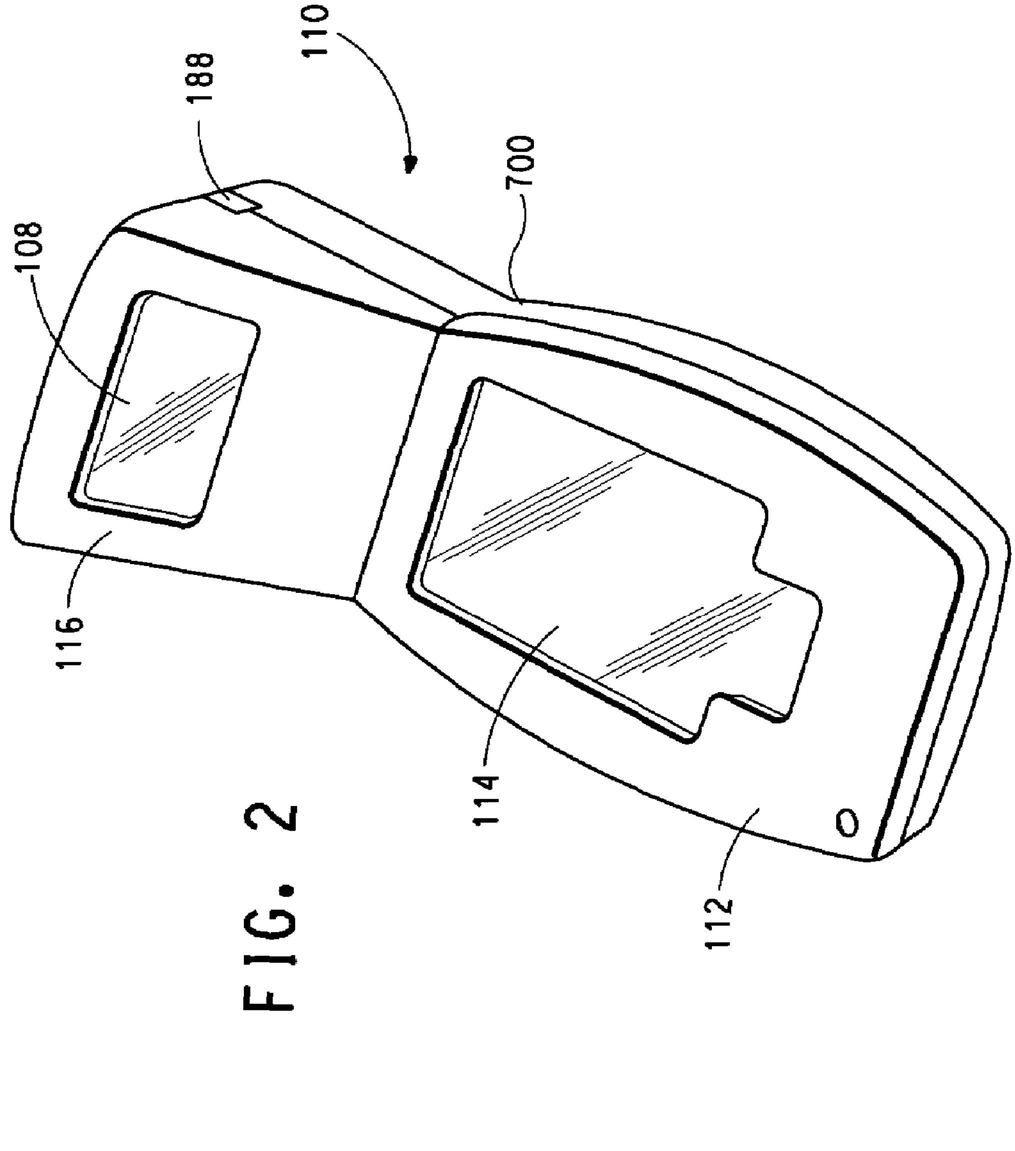
FIG. 2 illustrates one embodiment of the structure of the system for testing LED displays shown in FIG. 1.

FIG. 2 is a perspective view of the structure of one embodiment of the system 100. System 100 is contained within a portable (e.g., handheld) housing 110, which may be made of a lightweight material, such as plastic. Housing 110 includes a first portion 112, which contains handheld computer module 102. Portion 112 includes an opening that allows the screen 114 of module 102 to be displayed and accessed. In the preferred embodiment, screen 114 is a conventional LCD touch screen for displaying data from and inputting data into the computer module 102. Housing 110 further includes a removable cover portion 116, which houses the LED display 108 to be tested. Cover portion 116 includes a generally rectangular opening that allows the LED display 108 to be viewed. Display 108 may be removably attached to portion 116 in any conventional manner (e.g., by use of removable fasteners, sliding or snap-fit engagement, or the like). Portion 116 may attach to portion 112 by way of a snap-fit engagement.

The Housing 110 further includes a third portion, the Housing Chassis 700, to which 116, 112, 102 and 104 are mounted. Thus, Cover Portion 116 may be of different sizes to accommodate different LED displays 108. Thus, multiple displays of different shapes and sizes can be tested without redesigning the Housing 110.

Figure 3:
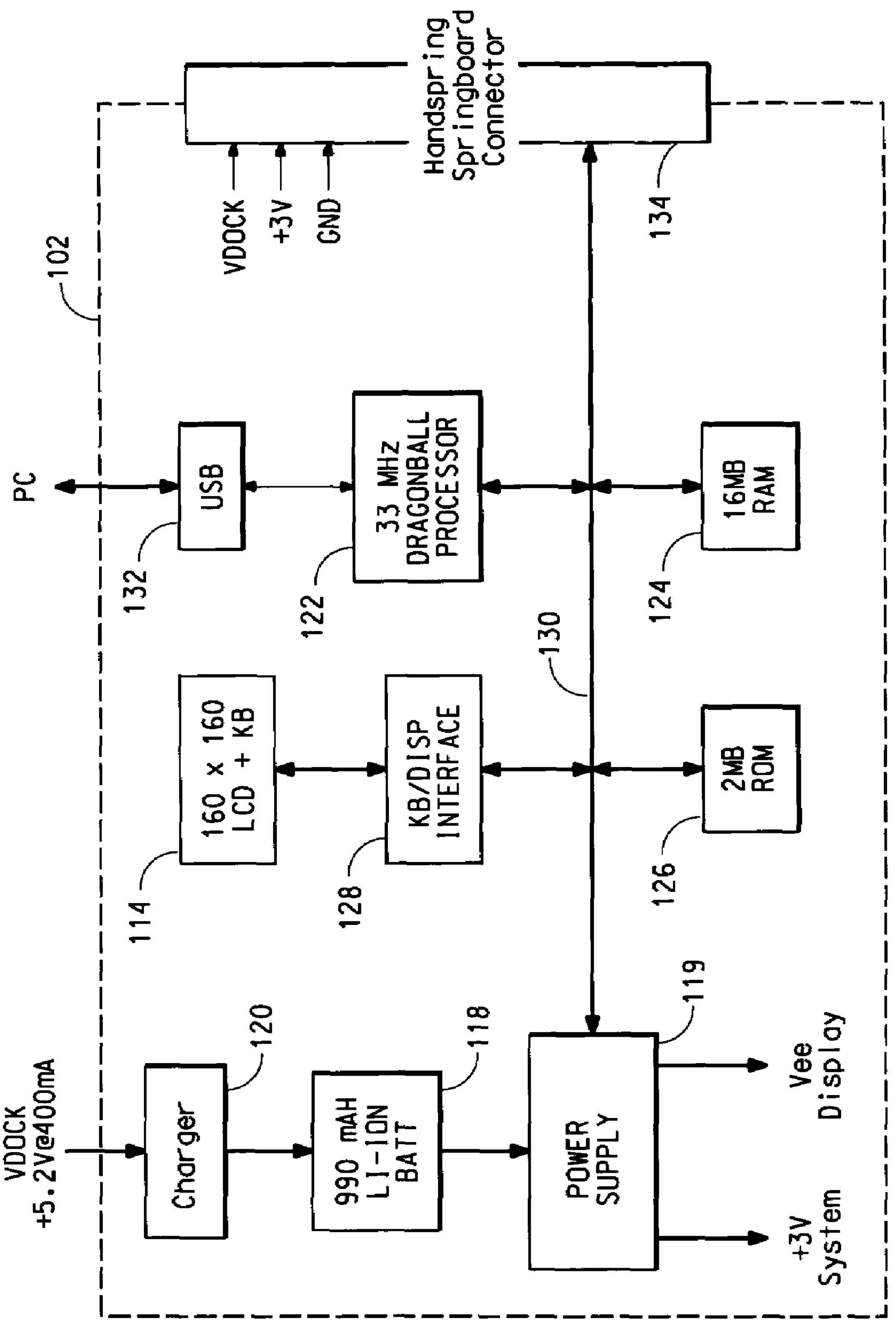
FIG. 3 is a schematic diagram of a portable computer module for use in system for testing LED displays, shown in FIG. 1.

The components of system 100 will now be described in greater detail. Computing module 102 comprises a battery (and/or line) operated, handheld computer system that is adapted to stimulate and monitor the performance of LED display modules. In one non-limiting embodiment, the core of the computer module 102 may be based on the electronics from a Handspring Visor Pro™ module running a Palm™ operating system. FIG. 3 is a block diagram of one embodiment of a handheld computer module 102. The computer module 102 is powered by a rechargeable battery 118, such as a lithium ion battery. Battery 118 is coupled to a charging circuit 120, which is adapted to receive power (e.g., from a portable charger or powered USB cable) and to use the power to recharge battery 118. Battery 118 is further coupled to a power supply circuit 119. Power supply circuit 119 receives electrical power from battery 118 and converts (e.g., steps down) the power into a desired operation voltage (e.g., 3 volts), which is communicated to the components of module 102 and system 100. Power supply 119 may also be coupled to a voltage display (not shown) for indicating the state of charge of battery 118.

Computing module 102 further a conventional processing unit 122, volatile (e.g., RAM) memory 124, non-volatile (e.g., ROM) memory 126, and a display interface circuit 128. Processor 122, memory units 124 and 126, and display interface circuit 128 are communicatively coupled together by way of system bus 130, which allows data to be transferred between the components of computer module 102. In one embodiment, processor 122 comprises a Motorola DragonBall™ processor (Product No. MC68VZ328) operating at 33 MHz. Processor 122 is further coupled to a USB port 132, which allows the computer module 102 to be coupled to and communicate with another computing system, such as a laptop, desktop or other personal computing device. Display interface 128 is a conventional display interface for translating and communicating signals to and from display 114. System bus 130 is coupled to a connector or bus interface unit 134, which is used to operatively and communicatively couple computer module 102 to test springboard module 104, and to communicate bus signals, operating voltage (e.g., +3V), docking voltage VDOCK (e.g., 5.2V), and ground GND signals to module 104.

Figure 4A:
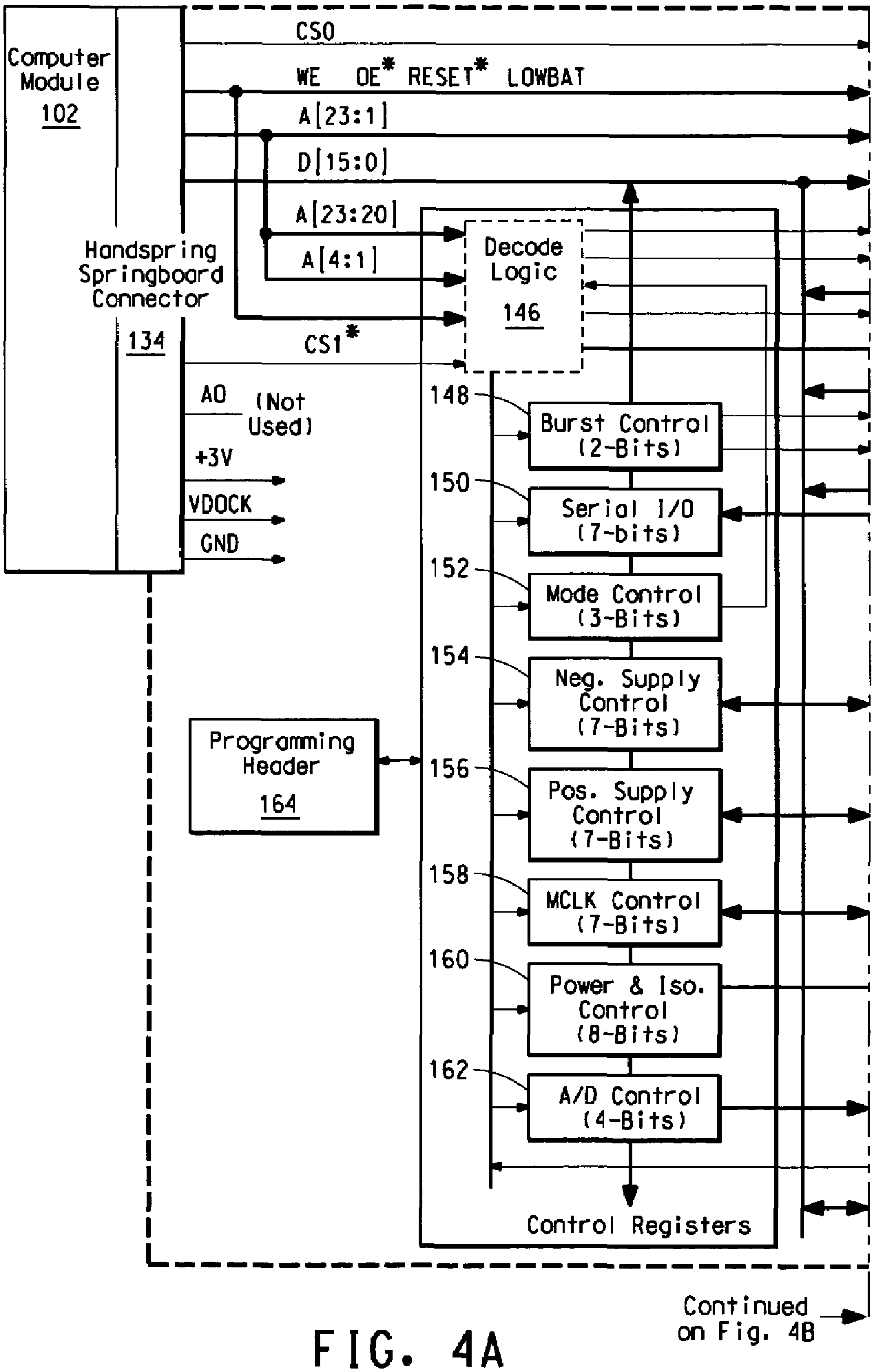
FIG. 4 is a schematic diagram of the system for testing LED displays, shown in FIG. 1.
Figure 4B:
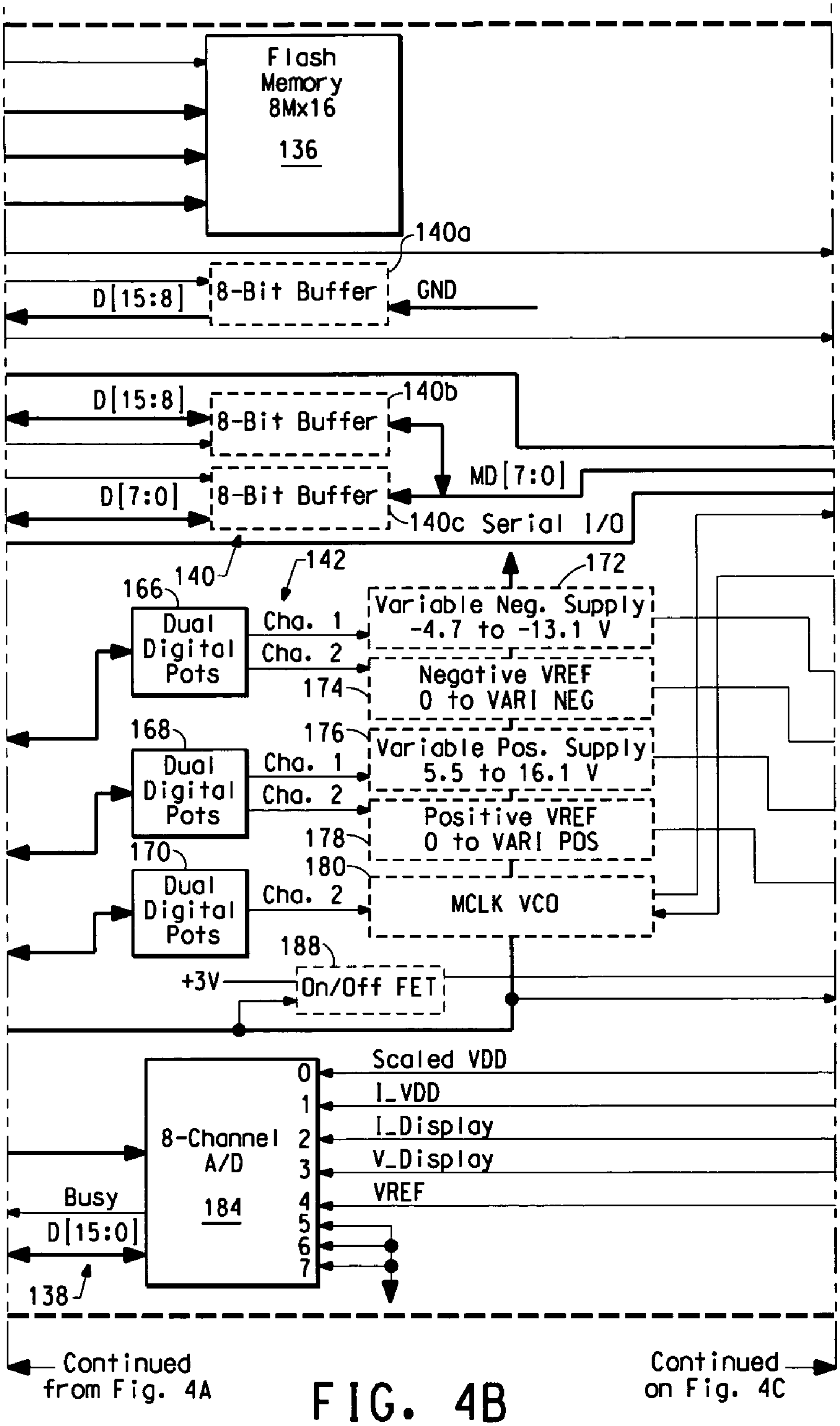
Figure 4C:
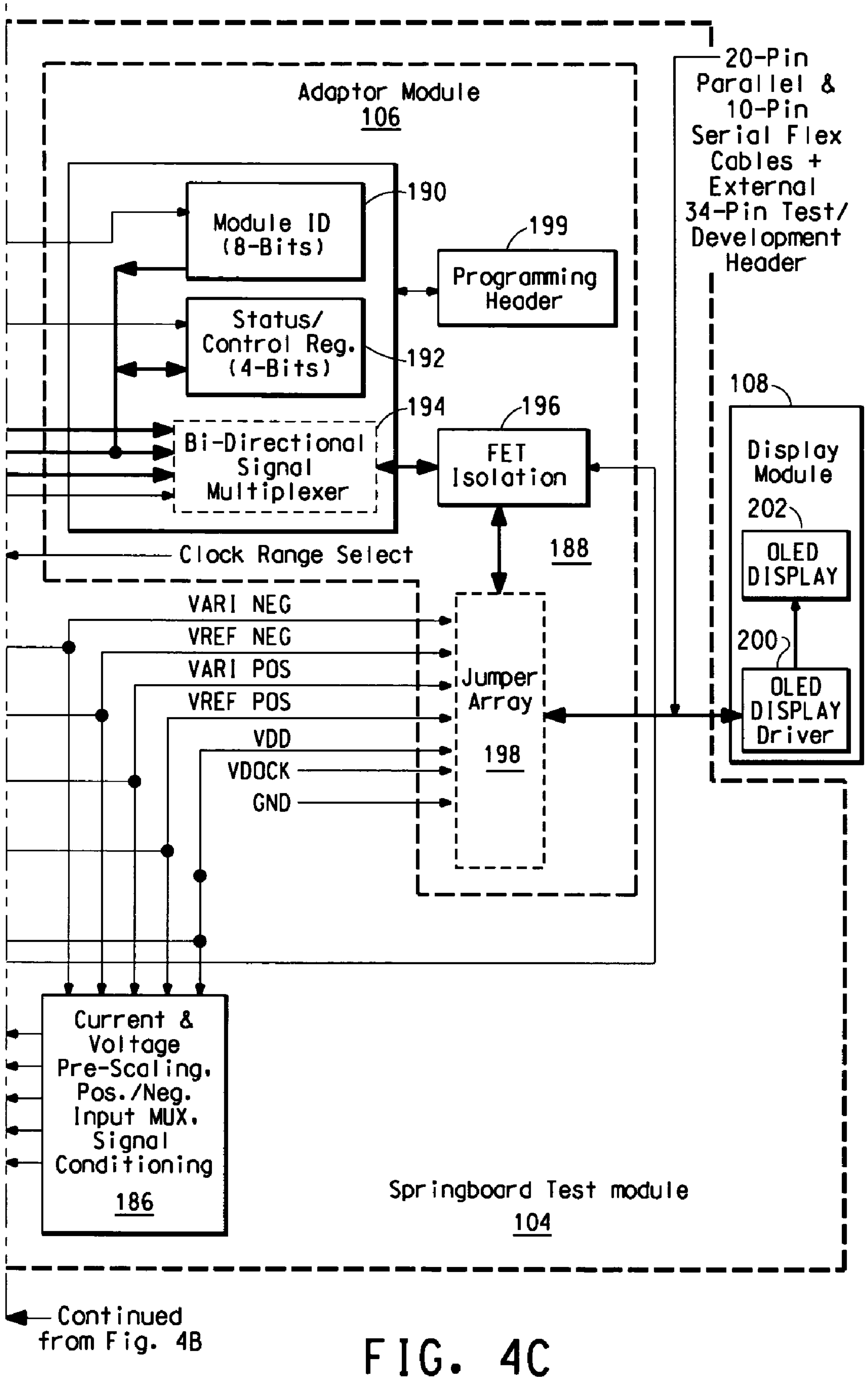

FIG. 4 illustrates detailed schematic diagrams of embodiments of the springboard test module 104 and the adaptor module 106. Test module 104 includes several circuits or circuit portions, including a non-volatile memory unit 136, and a data acquisition and control circuit 138, including a decoder 146, registers 148-162, buffers 140*a-c*, a voltage control circuit 142, and an analog to digital (A/D) conversion circuit 144.

Memory unit 136 is adapted to store the program(s) and images used to test the LED display 108. Memory unit 136 comprises a conventional non-volatile memory device, such as a flash memory device. In one embodiment, memory unit 136 may comprise Intel® flash PROM, product number E28F128J3A. Memory unit 136 is communicatively coupled to computer module 102 by way of several buses. As shown, the buses may provide a memory space select signal (CS0*) for selecting a portion of memory space. In one embodiment, the contents of memory unit 136 are mapped to a first section of memory space that may be accessed by use of the CS0* signal. Other components and elements of test module 104 are mapped to another section of memory space that may be accessed by use of the CS1* signal. The buses further provide conventional address and data signals (A[23:1] and D[15:0], respectively), a write enable signal (WE*), an output enable signal (OE*), a reset signal (RESET*), and a low battery signal (LOWBAT*). These signals are used in a known manner to control operation of and data transfer to and from the memory unit 136.

The decode logic 146 and control registers 148-162 may provide most of the analog control and monitoring functions of the system 100, and various control logic. Control registers 148-162 may be communicatively coupled to a conventional programming device by way of connector or programming header 164. In general, bits that can be written to the control registers 148-162 can also be read. This is beneficial because it allows use of test-and-set type instructions and reduces or eliminates the need for intermediate variables and/or register caching. The control registers 148-162 may also receive several bits that are read-only (e.g., the ModuleID bits MD[7:0] and A/D BUSY bit), and there may be bits in any of the peripheral chips (e.g., the display controller 200, A/D circuit 144, or control registers within the flash memory 136) that can be written and not read.

Decode logic 146 is a conventional address decoding and signal routing circuit. Decode logic 146 receives addresses and signals and decodes the addresses to route the signals to the correct destinations (e.g., to control registers 148-162, module ID register 190, and status control register 192). Decode Logic 146 also provides selective enable and direction control signals to data buffers (e.g. buffers 140*a*, 140*b* and 140*c*). Decode logic 146 may also provide a parallel interface control signal to multiplexer 194 to enable serial I/O to the display module 108.

The Burst Control register 148 provides an acceleration of data transfers from the flash memory unit 136 to a display controller 200 within display module 108, and frees the system 100 from concerns over byte order in a system of heterogeneous processor types. Advantageously, the register 148 accomplishes this function with very simple hardware. In one embodiment, there are two bits in the Burst Control register 148. A first programming bit D1 high enables burst mode transfers. D1 is low after reset (hardware or software reset) implying that burst transfers are disabled immediately after reset. A second programming bit D0 selects either the high data bits (D0=1 selects D15:D8) or the low data bits (D0=0 selects D7:D0) from the system's 16-bit data bus for the first data transfer to the 8-bit display controller 200. Each time a byte is written to the display controller data port, the programming bit D0 changes state. Therefore, the system hardware supports processor reads of one 16-bit integer value from the memory unit 136 followed by two consecutive writes of the same 16-bit value to the display controller data port. The system 100 may automatically select first one byte and then the other out of these two consecutive write cycles for transfer to the 8-bit display controller 200. After two writes, the system application may read another 16-bit value and perform two more writes until all required data is transferred. Note that data transfers to odd byte beginning and/or ending boundaries can be accomplished by setting D0 to the desired state and then performing one read followed by a single write before beginning read and double-write cycles, by ending a burst transfer with a read and a single-write cycle, or in any other suitable manner. Not only does this architecture allow the system to function with half as many data read cycles to execute 8-bit transfers to the display controller 200, its is likely that the burst cycles will be cached operations leading to further acceleration. The buffers 140*b* and 140*c* enable data to be alternately transferred from D[15:0] of the connector or bus interface unit 134 to the 8-bit parallel I/O bus of multiplexer 194 and ultimately to the 8-bit bus of display module 108 during these transfers.

The serial I/O register 150 is a parallel interface to the serial bit stream used to control a variety of serial interface options available for a display controller 200. The application software of system 100 may include a library of reusable software modules to pass serial bit streams through this parallel interface port in a fashion and protocol compatible with the many serial options available on display controllers/drivers that may be tested with system 100, such as Solomon™, Clare™ and other display controllers/drivers. This port is provides another way of passing the same command and data values to and from the display controller 200 as is passed through the 8-bit parallel interface, only presumably slower and potentially over longer data lines.

The mode control register 152 may assist in the initial configuration of the system. This register 152 may include three bits. A first data bit D0 may be used to indicate the type of the display module that is attached (e.g., a Solomon™ or Clare™ type module). The first bit D0 may then in turn be used to generate either a D/C# signal for talking to data and command ports (e.g., in Solomon™ mode), or the A0 line for selecting between data and commands (e.g., in Clare™ mode). Additional bits may be used to indicate other types of display modules and/or controllers and to cause the system to operate in a manner compatible with such controllers.

A second data bit D1 in this register may be used to select a processor parallel mode (e.g., an 8080 or 6080 mode). In 8080 mode (e.g., for controllers using 8080 type processors), the data acquisition and control circuit 138 will generate RD# and WR# strobes to communicate with the display controller 200. In 6800 mode (e.g., for controllers using 6800 OR 68000 family type processors), the data acquisition and control circuit 138 will generate EN and RD/WR# signals to talk to the display controller 200. The system's application software will appropriately set both of the above bits after reading the module identification signal. Additional bits may be used to indicate other types of display processors and to cause the system to operate in a manner compatible with such processors.

A third data bit D2 in this register provides a software reset function for hardware on the springboard test module 104, adaptor module 106, and display module 108. This bit may be combined logically with a reset line to provide an overall reset to all components of modules 104-108 with the exception of the flash memory unit 136. (This bit does not reset the memory 136 or the core electronics of computer module 102.) Software reset may be performed when this bit is written low (e.g., by use of the RESET* line), and may be removed when this bit is written high again. This bit is inactive (high) after a hardware reset of the computer module 102.

The negative power supply control register 154, positive power supply control register 156 and clock control registers 158 are the parallel interfaces to the serial bit stream used to control the potentiometers 142, which may comprise three dual digital potentiometer devices 166, 168 and 170. Each of the potentiometer devices may include two digital potentiometers that each control a different functional element of system 100. In one embodiment, potentiometers 166-170 provide control signals to power supplies 172-180, which in turn provide negative and positive voltage control signals to the display module 108 (e.g., supplies 172, 174, 176 and 178), and MCLK signals to the display module 108 (e.g., supply 180). The application software may include a library of software modules to pass serial bit streams through these parallel interface ports in a fashion and protocol compatible with monitoring and controlling the potentiometers 166-170.

The potentiometers 166-170 perform the same electronic adjustment as a mechanical potentiometer but offer enhanced resolution, solid-state reliability, and improved temperate coefficient performance. The desired potentiometer value may be stored in memory and reloaded both during initial power-up (controlled by circuits internal to the potentiometers). Each device may support 16 modes of operation including: memory storing and retrieving (typical operation); scratch pad programming in which values are written directly to the channel registers within the potentiometers; increment/decrement modes; and log taper adjustment. Each device may also include thirteen 16-bit words of user-defined memory that are available for general use. In one embodiment, the actual resistor tolerance of a potentiometer is stored in the memory at the time it is manufactured; therefore the actual end-to-end resistance can be known and used in calibration, tolerance matching, and precision applications in general.

Some suitable additional applications of the potentiometers' memory might include storing a unique serial number for the testing system 100, the current revision level of the system's overall assembly and/or its subassemblies. (Items that remain relatively constant regardless of program or data updates to the flash memory unit 136.)

The analog voltages and the LED display currents controlled by the potentiometers may also be monitored by A/D input channels. The A/D circuit 144 (e.g., the A/D converter 184 and its input channels) are designed to be very accurate, while the potentiometer outputs may be less accurate. Therefore, it may be desirable that the system's application software uses the digital potentiometers to set initial values near the desired values, and then use the A/D as a controlled feedback channel to measure actual outputs and adjust potentiometer setting to obtain final values for the desired settings. Also note that the optimized settings as determined by the A/D can be measured under normal loaded conditions, whereas calculations can be used to set initial control values for power supply outputs prior to the outputs being loaded.

The power and isolation control register 160 provides control of the positive and negative power supplies to the to display module 108 and its supporting electronics under software control. Particularly, control register 160 may be used to select positive and/or negative inputs to the A/D converter 184, selectively enable/disable FET data buffers 196, selectively enable/disable logic power VDD to the display module 108 (e.g., by use of FET switch 188), selectively enable/disable positive power to the display module 108, selectively activate/deactivate the positive power supplies 176 and 178, selectively enable/disable negative power to the display module 108, selectively enable/disable serial I/O, and selectively activate/deactivate the negative power supply 176 or 178.

The following process may be used to apply signals and power to a display module 108 for testing. The process can be logically divided into six steps, four of which are controlled register 162 (only Steps 3 and 6 below, which adjust and measure power supply voltages, are performed by registers 154, 156). The process may include the following steps:

Step 1—Turn on the negative power supply (e.g. for a Solomon™ type Driver), or turn on the positive power supply (e.g., for a Clare™ type Driver).

Step 1A—When the negative power supply is used, enable serial I/O control to the negative power supply just after step 1. (If the positive power supply is used, this step may be skipped.)

Step 2—Select either the negative or positive inputs to the A/D converter 184 (based on whether the negative or positive power supply was turned on in Step 1).

Step 3—Make preliminary adjustments to the negative or positive power supply if necessary, by use of control registers 154, 156 and potentiometers 166, 168 and monitored by the A/D converter 184.

Step 4—Enable either the positive power supply 176,178, or the negative power supply 180, 182 to the display module 108. Enable the logic power to the display module 108 by use of FET switch 188.

Step 5—Enable the display module FET data buffers 196 (removing data signal isolation).

Step 6—Monitor and potentially adjust the power supply again after power is enabled to the display controller 200 and the display controller logic has been full initialized.

To power down a display module 108 the above steps may be reversed, skipping step 6. Note that it may be advisable to set the adjustable power supply to some reasonably small absolute value in step 3 during the shutdown phase to avoid potential damage to devices under future startup conditions.

The A/D control register 162 is a parallel interface to the external control bits for the A/D converter 184, which in one embodiment, may be an Analog Devices™ A/D converter, part number AD7859L. The A/D converter 184 may operate in single-end mode. (All inputs are a single voltage source referenced to ground.) A precision external reference of 2.5V (e.g., 0.05% initial absolute accuracy, 10 ppm/° C.) may be applied to the A/D reference input. This input provides the baseline reference for a maximum (FFF hexadecimal) reading of the A/D output. An input at ground potential is intended to provide a reading of 000. The self-calibration cycle of the A/D automatically calibrates the internal gain and offset of the A/D input channels to provide the full-scale reading from 000 to FFF for input levels that range from ground to 2.5V. (A system accuracy calibration cycle may also be available.)

All inputs to the A/D converter 184 are pre-scaled and low-pass filtered to provide signals in an acceptable voltage range for the A/D converter 184 that do not fluctuate substantially. Signal conditioning circuit 186 is used to measure operating attributes of the display module 108 and to perform pre-scaling and conditioning of signals communicated to A/D converter 184. The A/D converter 184 then converts these inputs into digital values. The A/D converter 184 may itself provide a track-and-hold function that allows inputs to be sampled and then held constant during A/D conversion. During an A/D conversion cycle an A/D BUSY bit remains active high until the conversion is complete. In one embodiment, the A/D input channels may include:

Channel 0—scaled logic voltage
Channel 1—logic current
Channel 2—display current
Channel 3—display voltage
Channel 4—reference voltage The system 100 also includes a display adaptor module 106 that allows the springboard module 104 to be easily adapted to drive a wide assortment of physical interconnect schemes to accommodate various display modules 108. The display adaptor module 106 also provides a convenient set of user test points, thus allowing a user to independently verify system operation and observe all power and communication flow to and from a test display module.

The display adaptor module 106 may be comprise an interconnect board 188 (see FIG. 2) that connects the LED display module 108 to the springboard module 104. The interconnect board includes a plurality of different controller, connector, and interface schemes to be employed on the display module 108 without requiring hardware changes to the springboard module 104. In essence, it provides the display module-specific "glue logic" for the system.

In addition to interconnections, the display adaptor module 106 may contain: 1) current and voltage test point pins for the power to the display module (not shown); 2) circuits for independently controlling turning power on and off for the display and logic (not shown); 3) preconditioning circuits for A/D input of display and logic voltage and current (not shown); 4) an 8-bit module ID circuit 190; 5) in the case of a Solomon™ type driver the adaptor may contain a DC/DC converter to provide $V_{EE}$ and $V_{REF}$ signals; 6) a status control register 192; 7) a signal multiplexer 194; 8) a FET isolation circuit 196; and 9) a connector or jumper array 198. Display adaptor module 106 may be communicatively coupled to a conventional programming device by way of connector or programming header 199.

Voltage test point pins may comprise pin pairs with the test voltage on one side and ground on the other. Current test point pins may be pin pairs with a precision resistor connected between the pin pair sized to produce roughly a 100 mV signal at the absolute maximum expected operating currents. Logic and display power control may be accomplished by use of FET switches 196 with low on-resistance in the power supply lines that can be controlled by software. Adaptor module 106 may also include preconditioning circuits (not shown) for display and logic voltage and current circuits may comprise precision resistor dividers and operational amplifiers to scale all inputs to approximately 0 to +2.5V full scale for A/D input.

The display identification or module ID circuit 190 is used to determine the identification information or data for the display module 108. For example, the module ID circuit may determine the type of display controller 200 used (e.g., Solomon™ 1301, Clare™ 301, or other suitable controller type); the type of LED display 202 used; and special programming and initialization values used; and identify a table of images within memory unit 136 that may be displayed during testing. The module ID circuit 190 may comprise an 8-bit buffer and resistor strapping options for 1's and 0's. By way of example, initial module ID strapping options may include $00_{hex}$ for a Solomon™ type driver with a 128×64 display, and $01_{hex}$ for a Clare™ type driver with a 128×64 display. It should be appreciated that ID circuit 190 may include additional and/or different strapping options for identifying different types of displays, controllers and/or drivers. The display adaptor module 106 may also contain a DC/DC converter for producing display power and reference voltages beyond those offered by the positive power supply 176, 178, or the negative power supply 180, 182. The DC/DC converter may be either a population option, or may require a different PCB.

The connector or jumper array 198 from the display adaptor module 106 to the display module 108 may comprise a 20-pin parallel connector and flex cable, a 10-pin serial connector and flex cable, and an external 34-pin connector and flex cable for allowing communicative attachment of an external test or expansion module. Other suitable connectors may also be used based on the application. Connector 198 communicatively couples display module 108 to adaptor module 106 and provides for communication of control, clock and power signals to and from the display module.

The status control register 192 is adapted to read or write status and control information in the adaptor module 106. The external input/output bits of this register may in turn be used to control functions on a display module such as internal or external clock drive selection, or parallel or serial module operation.

The multiplexer 194 of adaptor module 106 is communicatively coupled to and receives data and control signals from decode logic from springboard module 104, as shown in FIG. 4. Multiplexer 194 communicates these signals to display module 108 by use of isolation FET switches 196 and connector 198.

The system 100 provides for downloading and displaying of user-selected images, image sequences (e.g., animations), and power signals for testing of the display. Preferably, the images can be provided by an operator by downloading image files from a personal computer (e.g., by use of the USB port 132). The system 100 will include software utilities for accepting bit map or other graphic images files (e.g., in 1- and 4-bits per pixel format) for download to the memory unit 136, where the images can later be communicated to the display module 108 being tested. Simple animations may be generated by displaying a series of images at a predetermined rate (e.g., 30 frames a second). The system 100 may employ PC utilities to perform these functions. In one embodiment, the PC utilities may include: 1) the ability to update display images stored in memory unit 136; 2) the ability to transfer stored data (log files) from system 100 back to the PC; and 3) the ability to download code updates for the operation of system 100 (e.g., maintenance operations).

II. Operational Software

The operational software of the present invention will now be described in terms of the screens provided and the underlying support utilities that are controlled by the user interface. The screens described below are merely exemplary embodiments. It should be appreciated that various screen implementations may be used based on the controller and display type being tested and/or based on user preferences.

Image Control Screen

Figure 5A:
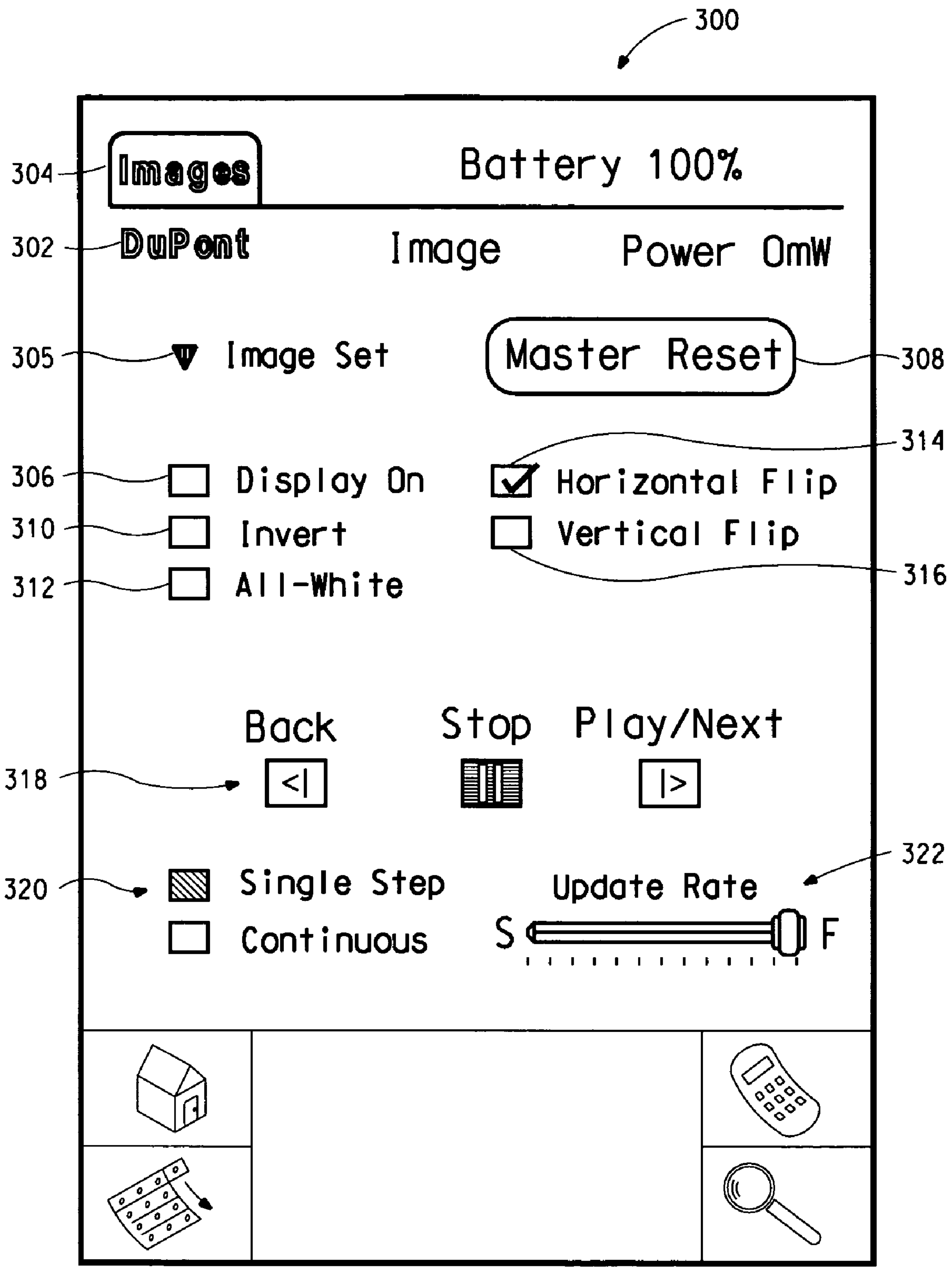
FIGS. 5A-C depict an exemplary user interface screen for image control that may be displayed by the system shown in FIG. 1.
Figure 5B:
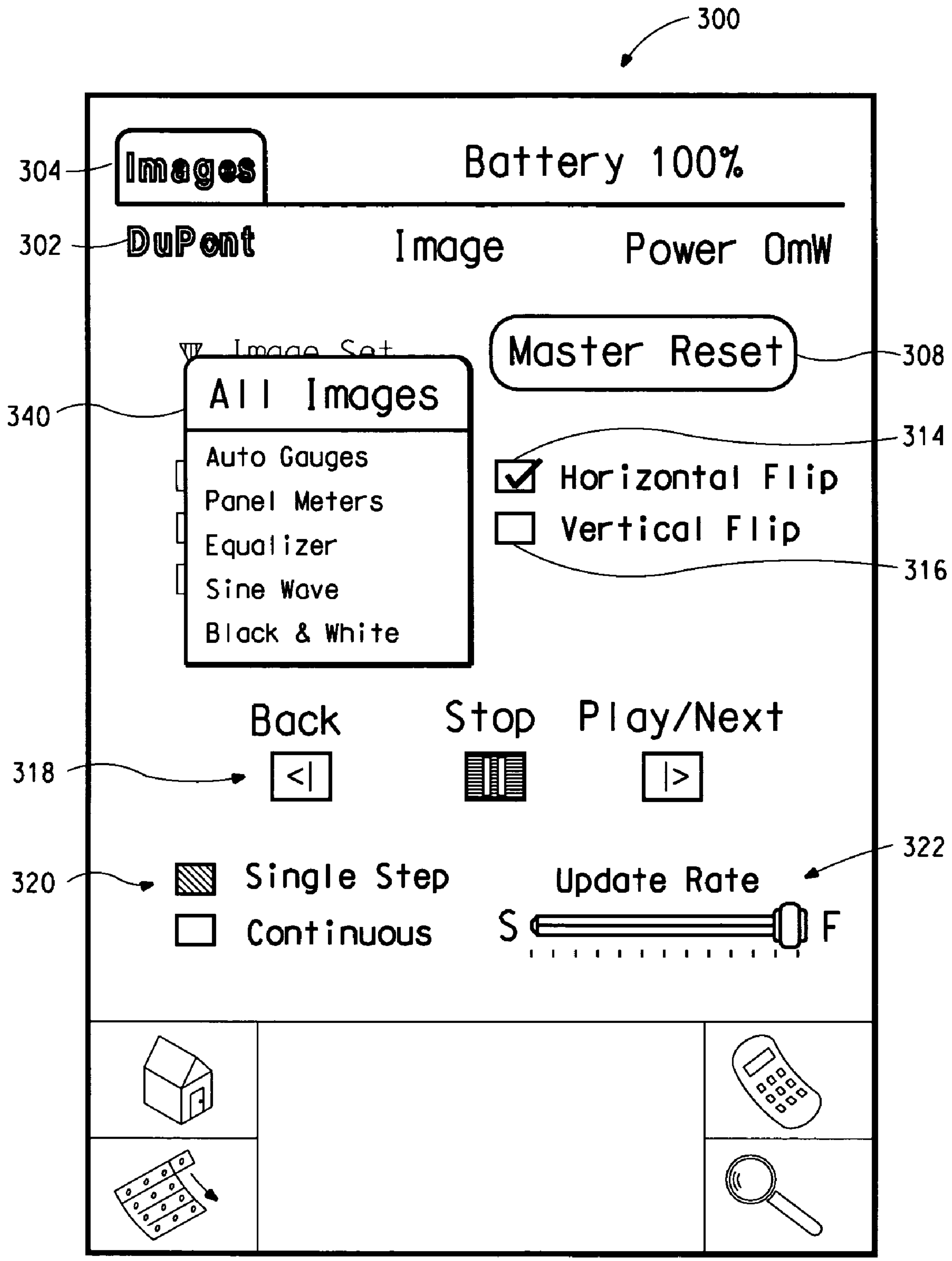
Figure 5C:
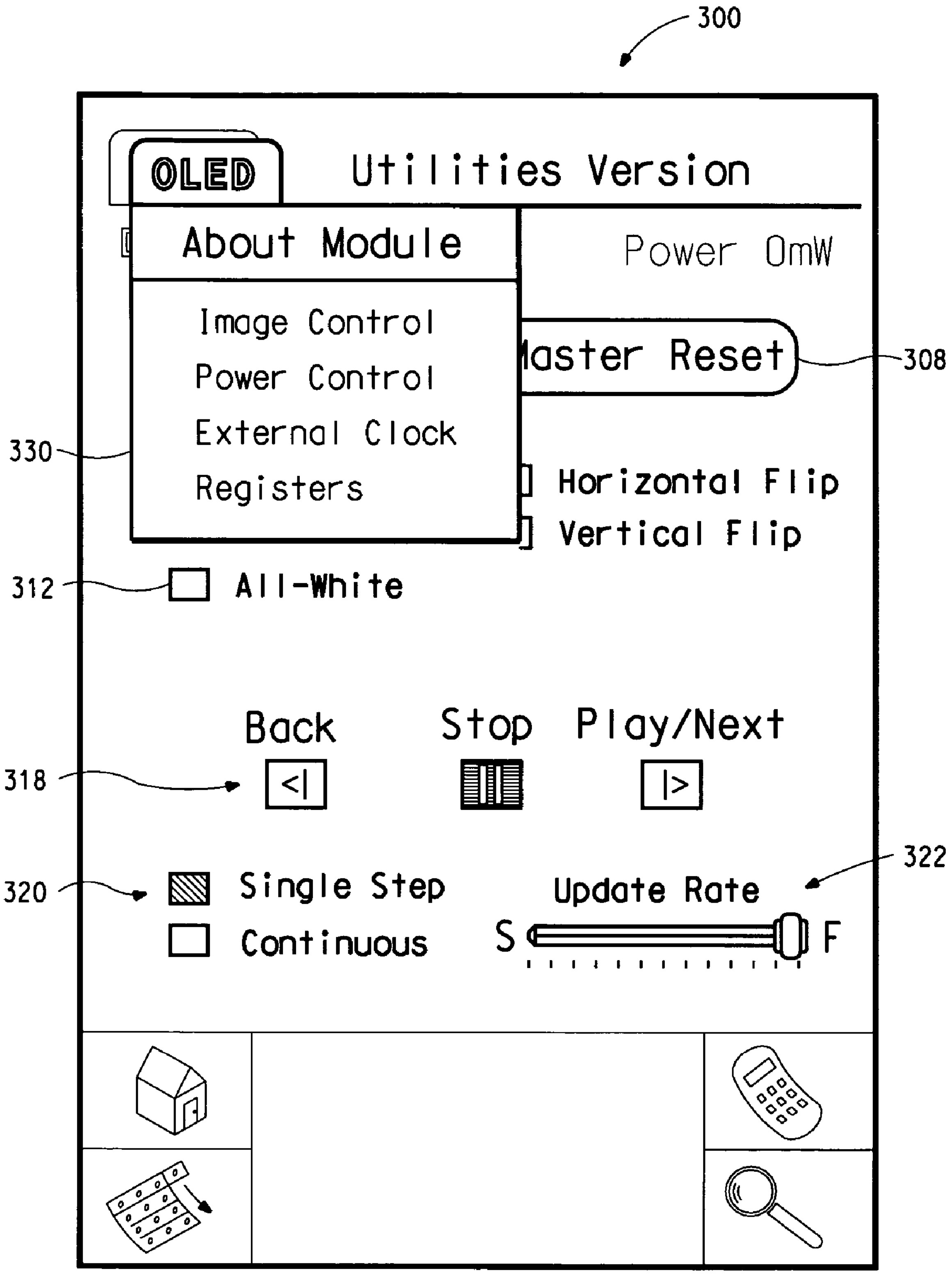

FIGS. 5A-C illustrate one example of an image control screen 300 that may be displayed on screen 114 when the system 100 is activated. System 100 may display the text translation of the eight-bit module ID that is identified by adaptor module 106 (e.g., by Module ID circuit 190). This text is displayed at the top left of this (and every) screen, as shown in region 302. In the example shown above, the text reads "DuPont". It should be appreciated that any desired module and controller types may be programmed into and identified by the system 100.

In the top left corner of this and every screen, the system 100 displays a tab region 304 that may be selected to provide a utility bar for navigation. In this case, the image control screen 300 is selected (highlighted), and the screen title reflects this selection by displaying "Images" in text within the tab region 304. As shown in FIG. 5C, a utility pull-down menu 330 may be used to select between Image Control, Power Control, External Clock and Registers screens. Referring back to FIG. 5A, below the Module ID text 302 and screen title 304 are a plurality of boxes labeled Display On/Off, Invert, All-White, Master reset, Horizontal Flip and Vertical Flip. The Display On/Off function 306 turns power on and off for the display device being tested. Note that there may be required sequences to for bringing power up and removing power from the display drivers, and that software control of FET power switches 196 must be carefully observed to avoid damaging display modules. The Master Reset button 308 returns the display device controls back to the original manufacturer-recommended conditions. The Invert box 310 controls whether the normal or inverted images are displayed. The All-White box 312 may be selected to cause the screen to go an All-White (all on) display. In this manner, a user can determine whether all pixels on the display module 108 are functional, and whether the module 108 correctly displays inverted images. The Horizontal and Vertical Flip boxes 314, 316 allow a user to flip the displayed image 180 degrees in a horizontal or vertical direction, respectively. An Image set arrow 305 may be selected to allow a user to select different image sets or animations to be communicated to the display being tested. When the arrow 305 is selected, a pull down menu 340 appears, as shown in FIG. 5B, illustrating the various images that may be selected.

Toward the bottom half of the Image Control screen, image presentation controls 318 are provided for controlling the presentation of images. Images and animations can be Stopped, Selected and/or Played using the buttons 318 provided. Display mode buttons 320 allow a user to determine how the images and/or animations will be displayed. One of two display modes may be selected from the buttons labeled Single-Step and Continuous-Step. Single-Step provides one image at a time and that image remains constant until the Next/Play button is pressed, thereby advancing the display to the next image. The Continuous Step button provides a continuous sequence of images assuming the Next/Play button is active. Pressing the Stop button pauses continuous image advancement (without taking the unit out of continuous play mode) until either the Previous/Rev (reverse) button or Next/Play button are pressed. The slider bar 322 labeled Update Rate provides control of the step interval if the unit is in Continuous Step mode. The value of this box may be set using a stylus input, and the system will provide predetermined default values (e.g., a 5 Hz step interval). In this manner, the display module 108 can be tested to insure proper display of images and animations.

In alternate embodiments, the Image Control screen 300 may also include various other control features such as a Brightness slider bar, which provides overall screen brightness control for the display device under test. The slider bar would allow a user to observe and check the change in brightness of display 108. The screen may also include pixel depth selection buttons, for allowing a user to select either different pixel depths, such as 1- or 4-bits per pixel.

Power Control Screen

Figure 6:
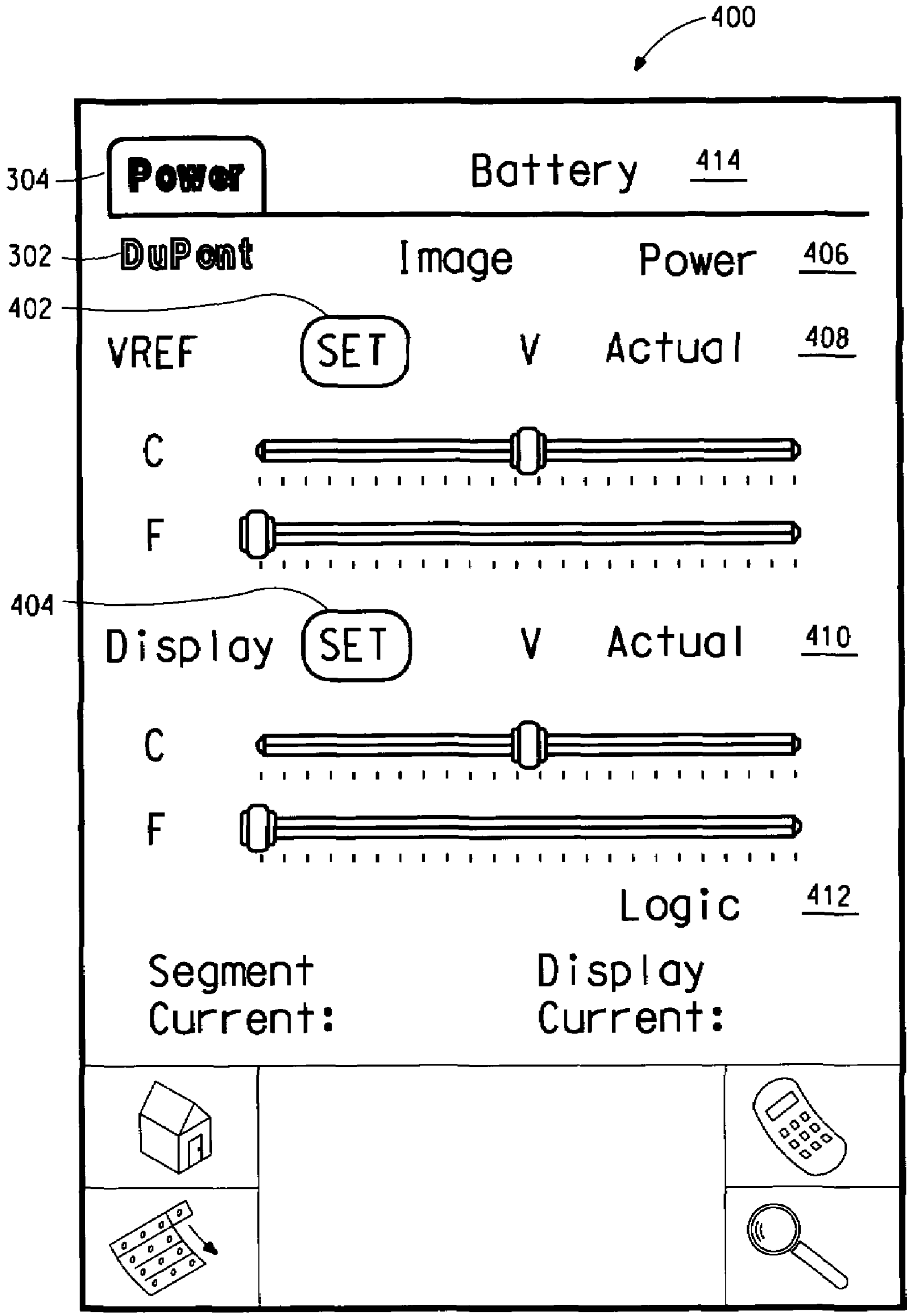
FIG. 6 depicts an exemplary user interface screen for power control that may be displayed by the system shown in FIG. 1.

FIG. 6 depicts one example of a Power Control Screen 400 generated by system 100 for allowing power consumption data for the display module 108 to be tested and monitored. Screen 400 may be accessed by use of the Utility Pull-Down Menu by selecting the tab region 304. In this case, the screen name, Power, is shown in region 304.

The Power Screen 400 contains all significant power consumption readings for the display unit under tests. Measured values may include Segment current and Display current, shown at the bottom of the screen 400. The actual measured reference voltage (VREF), display voltage, and logic voltage, are also shown on screen 400 in regions 408, 410 and 412, respectively. These values may correspond to A/D input channels 0 thru 3 as described above. Screen 400 also displays the total power consumed by the display in region 406. In one embodiment, screen 400 may also illustrate other power values, such as logic power and display power. The values may be calculated as follows: $P_{Logic}=I_{Logic}*V_{Logic}$, $P_{Display}=I_{Display}*V_{Display}$, and $P_{Total}=P_{Logic}+P_{Display}$. The A/D representations of these current and voltage inputs may be determined during hardware detail design. Screen 400 (and all other screens) may display the state-of-charge of the battery 118 in the upper right hand corner region 414.

The reference voltage and display voltage can be controlled directly from this screen by selecting buttons 402 and 404, respectively, and sliding the course (C) and fine (F) control bars (e.g., for course and fine adjustments, respectively). When a desired value is reached, a user may tap the set button (402 or 404), thereby causing the system 100 to drive the display at this value.

Control Register Screen

Figure 7:
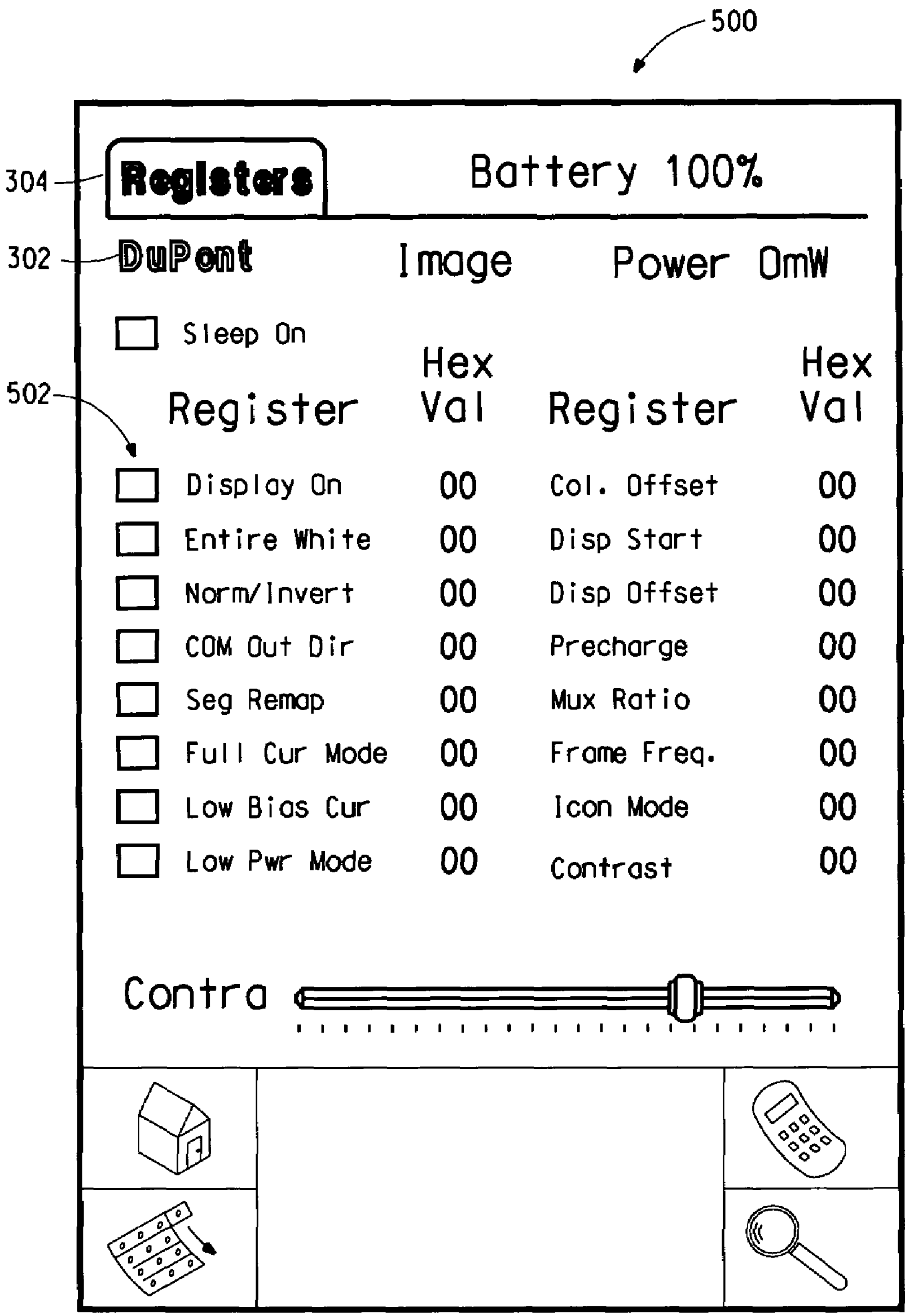
FIG. 7 depicts an exemplary user interface screen for adjusting control registers that may be displayed by the system shown in FIG. 1.
Figure 8:
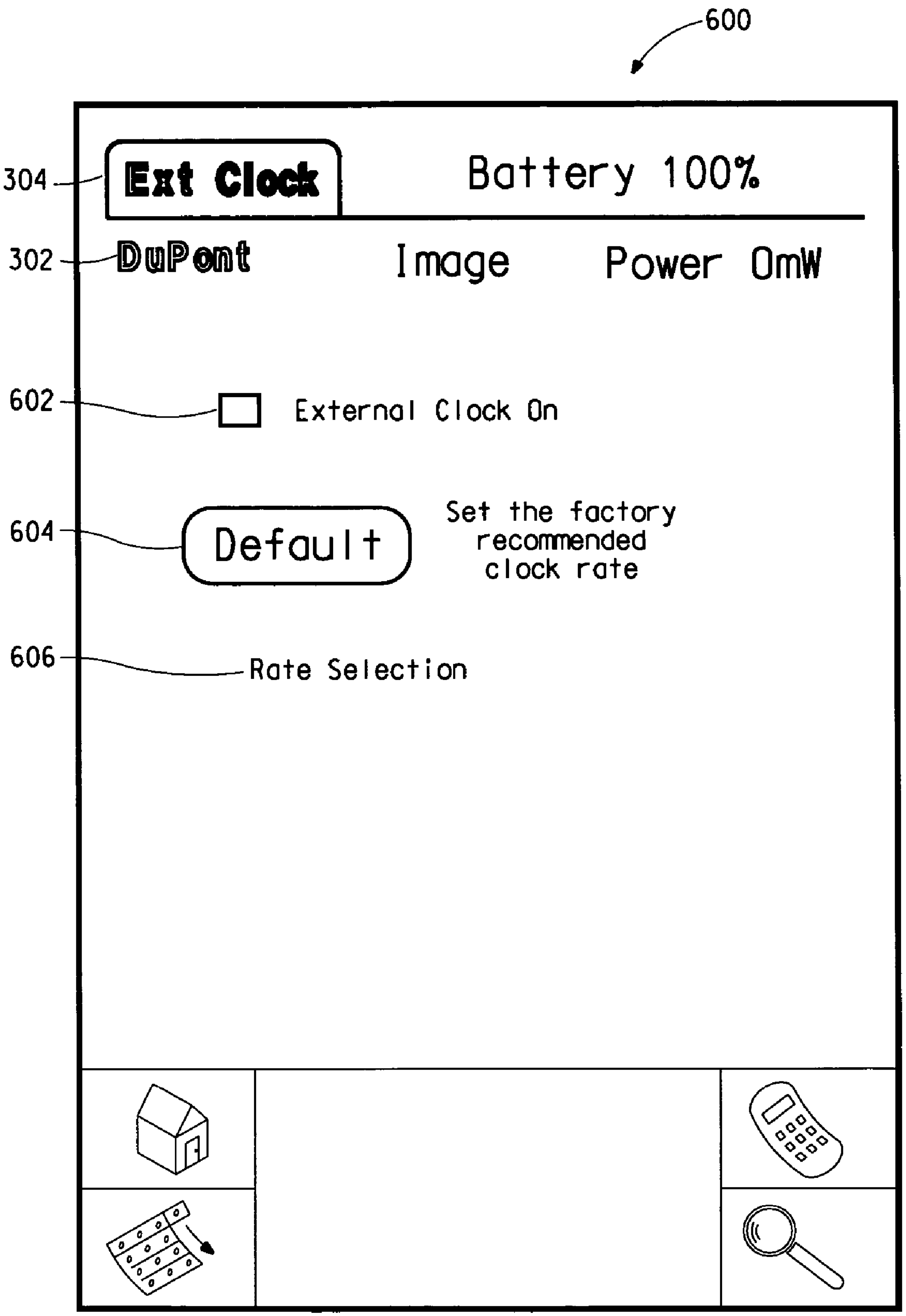
FIG. 8 depicts an exemplary user interface screen for adjusting the display clock rate that may be displayed by the system shown in FIG. 1.

FIG. 7 depicts a Control Register screen 500. Screen 500 illustrates an example screen for a Solomon 1301™ controller, but similar screens for other types of controllers may also preferably be created. Hex values for each control register of the controller/display type are shown in the screen 500. As control values on other screens are changed (e.g. the display on/off selection is toggled) those changes are reflected as in the Control Register screen 500. Similarly, if one or more values are changed in the control registers directly; those changes should also be reflected on other screens that many be impacted. The hex values shown in the control registers can be changed by selecting any one of check boxes 502. As will be appreciated to those skilled in the art, fundamental display operation can be changed by changing these register values. Therefore, in certain implementations it may also advantageous to limit the range of input values provided by the user to an acceptable range under software control. For example, a check box may be used to limit the values to one of two acceptable inputs, while the entry of hex values into a register field may be limited to acceptable values or a range of values.

Clock Rate Screen

FIG. 7 depicts an exemplary Clock Rate control screens 600. Screen 600 includes a clock activation box 602 that may be selected to activate an external clock signal (e.g., by use of control register 158). Screen 600 may also include a default box 604, which allows a user to set the clock rate of the display to a default factory recommended rate. The Clock Rate control screen 600 may also include one or more pull down menus of selectable clock rates, which may be accessible, for example, by selecting arrow 606. The pull down menu may contain rates that are available for a specific type of display or driver (e.g., Solomon™ and Clare™ drivers).

Those skilled in the art will recognize that the exemplary embodiments described above provide only a few of many display testing systems and methods that can be constructed according to the present invention. Various means and methods can be devised to perform the designated functions in an equivalent manner. Moreover, various changes, substitutions, and alternations can be made herein without departing from the principles and the scope of the present invention. Accordingly, the scope of the present invention should be determined by the following claims and their legal equivalents.

What is claimed is:

1. A portable, integrated system for testing and/or controlling operational attributes of electronic displays comprising:

a power supply for providing electrical power to the system;

a computing module for running operational software for testing a light-emitting diode LED electronic display based on an LED display type;

a memory unit for storing test images which are selectively displayed on the electronic display;

a test module that is communicatively coupled to the computing module and the memory unit and that is adapted to provide control and power signals to the electronic display for testing and displaying the test images on the electronic display according to the operational software, and to measure operational attributes of the display;

an adaptor module that is communicatively coupled to the test module and that is adapted to be removably coupled to the electronic display and to communicate power and control signals to the electronic display, the adaptor module including a display identification circuit that is adapted to identify the display type of the electronic display and to communicate the display type to a test portion, wherein the test portion comprises a plurality of potentiometer devices for controlling the values of power signals communicated to the electronic display device based on the display type; and a user interface that is adapted to accept user input data into the system for testing the electronic display and to display operational attributes of the electronic display;

wherein said operational attributes include: how images and/or animations will be displayed, screen brightness, power consumption, current and voltage inputs, hex values for each control register, pixel depth, or clock rate.

2. The system of claim 1 further comprising:

a handheld housing which is adapted to contain the power supply, memory unit, test module, adaptor module, and user interface.

3. The system of claim 2 further comprising a cover portion that is adapted to receive an electronic display to be tested, and to be removably attached to the handheld housing, effective to couple the electronic display to the adaptor module.

4. The system of claim 1 wherein the system is adapted to test organic light emitting diode (OLED) displays.

5. The system of claim 1 wherein the user interface comprises a touch screen.

6. The system of claim 1 wherein the operational attributes include current, voltage and power values.

7. The system of claim 1 wherein the computing module is adapted to select test images from the memory unit for displaying on the electronic display based on the display type.

8. The system of claim 7 wherein the test images include animation sequences.

9. The system of claim 1 wherein the test portion comprises an analog-to-digital (A/D) for converting measured attributes into digital values.

10. A system for testing and/or controlling operational attributes of a light-emitting diode display, comprising:

a computing module including:

a rechargeable power supply for providing electrical power to the system;

a processing element for running operational software for testing a light-emitting diode display; and a user interface that is adapted to allow a user to select from a plurality of test options for testing the light-emitting diode display and that is adapted to display measured operational attributes of the display;

a test module that is communicatively coupled to the computing module, the test module including:

a nonvolatile memory unit for storing test images to be displayed on the display; and a data acquisition and control circuit for communicating power and control signals for displaying the test images on the display, and for measuring operational attributes of the display;

a plurality of potentiometers for providing selectively variable power signals to the display;

an adaptor module that is communicatively coupled to the test module and that is adapted to be selectively and communicatively coupled to the display, to identify a type of the display and communicating the type to computing module, which uses the type to determine the plurality of test options for the display and to select corresponding test images and power and control signals to communicate to the display; and a portable housing that operatively contains the computing, test and adaptor modules, and which includes a removable cover portion that is adapted to receive and secure the display for testing;

wherein said operational attributes include: how images and/or animations will be displayed, screen brightness, power consumption, current and voltage inputs, hex values for each control register, pixel depth, or clock rate.

11. The system of claim 10 wherein the nonvolatile memory unit comprises a flash memory unit.

12. The system of claim 10 wherein the test module includes a signal conditioning circuit for measuring operational attributes from the display and an A/D converter that is communicatively coupled to the signal conditioning circuit and that is adapted to convert signals from the signal conditioning circuit into digital values for displaying on the user interface.

13. The system of claim 10 wherein the identification circuit is adapted to comprises strapping options.

14. The system of claim 10 wherein the user interface is further adapted to generate an image control screen for allowing a user to select and control the display of test images on the display.

15. The system of claim 10 wherein the user interface is further adapted to generate a power control screen for allowing a user to display and control operational attributes of the display.

16. The system of claim 10 wherein the user interface is further adapted to generate a clock rate control screen for allowing a user to control a clock rate of the display.

17. A method for testing and/or controlling operational attributes of electronic display modules, comprising the steps of:

providing a portable testing module;

removably attaching an LED electronic display to the portable testing module;

automatically detecting a type of the LED electronic display by use of the testing module;

providing test options for a user to select based on the LED display type;

receiving test option selections from the user;

providing signals to the LED electronic display based on the test option selections, effective to cause the LED electronic display to display selected images;

measuring operational attributes of the LED display; and displaying the measured operational attributes to the user, wherein said operational attributes include: how images and/or animations will be displayed, screen brightness, power consumption, current and voltage inputs, hex values for each control register, pixel depth, or clock rate.

18. The method of claim 17 wherein the step of automatically detecting a type of the LED electronic display comprises coupling the display to strapping options.

19. The method of claim 17 wherein the step of providing signals to the LED electronic display comprises providing sequences of selected images for animated display.

20. The method of claim 17 wherein the operational attributes comprise operational power, current and voltage values for the electronic display.

21. The method of claim 17 wherein the LED electronic display comprises an organic light-emitting diode display (OLED).

22. The method of claim 17 further comprising the step of storing the selected images in a nonvolatile memory unit.

* * * * *

UNITED STATES PATENT AND TRADEMARK OFFICE

CERTIFICATE OF CORRECTION

PATENT NO. : 7,573,286 B2
APPLICATION NO. : 10/439387
DATED : August 11, 2009
INVENTOR(S) : Huelson et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 413 days.

Signed and Sealed this

Seventh Day of September, 2010

David J. Kappos

*Director of the United States Patent and Trademark Office*